us010868513B2

(12) United States Patent
Yantchev

(10) Patent No.: US 10,868,513 B2
(45) Date of Patent: Dec. 15, 2020

(54) TRANSVERSELY-EXCITED FILM BULK ACOUSTIC FILTERS WITH SYMMETRIC LAYOUT

(71) Applicant: Resonant Inc., Goleta, CA (US)

(72) Inventor: Ventsislav Yantchev, Sofia (BG)

(73) Assignee: Resonant Inc., Goleta, CA (US)

( * ) Notice: Subject to any disclaimer, the term of this patent is extended or adjusted under 35 U.S.C. 154(b) by 0 days.

(21) Appl. No.: 16/924,105

(22) Filed: Jul. 8, 2020

(65) Prior Publication Data

US 2020/0343874 A1    Oct. 29, 2020

Related U.S. Application Data

(63) Continuation-in-part of application No. 16/829,617, filed on Mar. 25, 2020, which is a continuation of application No. 16/578,811, filed on Sep. 23, 2019, now Pat. No. 10,637,438, which is a continuation-in-part of application No. 16/230,443, filed on Dec. 21, 2018, now Pat. No. 10,491,192.

(60) Provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018,
(Continued)

(51) Int. Cl.
| | |
|---|---|
| *H03H 9/17* | (2006.01) |
| *H03H 9/54* | (2006.01) |
| *H03H 9/02* | (2006.01) |
| *H03H 9/13* | (2006.01) |

(52) U.S. Cl.
CPC ............. *H03H 9/171* (2013.01); *H03H 9/02* (2013.01); *H03H 9/54* (2013.01); *H03H 9/02015* (2013.01); *H03H 9/13* (2013.01)

(58) Field of Classification Search
CPC .. H03H 9/02228; H03H 3/04; H03H 9/02031; H03H 9/132; H03H 9/174; H03H 9/176; H03H 9/562; H03H 9/564; H03H 9/568; H03H 2003/023; H03H 2003/0442
USPC .......................................... 333/186, 187, 189
See application file for complete search history.

(56) References Cited

U.S. PATENT DOCUMENTS

| | | |
|---|---|---|
| 6,540,827 B1 | 4/2003 | Levy et al. |
| 7,463,118 B2 | 12/2008 | Jacobsen |

(Continued)

FOREIGN PATENT DOCUMENTS

| | | |
|---|---|---|
| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Benny T Lee
*Assistant Examiner* — Hafizur Rahman
(74) *Attorney, Agent, or Firm* — SoCal IP Law Group LLP; John E. Gunther

(57) ABSTRACT

There are disclosed acoustic resonators and radio frequency filter devices. An acoustic resonator includes a piezoelectric plate having a front surface. A conductor pattern is formed on the front surface, the conductor pattern including interdigital transducers (IDTs) of one or more pairs of sub-resonators, each pair consisting of two sub-resonators. The two sub-resonators of each pair of sub-resonators are positioned symmetrically about a central axis.

15 Claims, 12 Drawing Sheets

Related U.S. Application Data provisional application No. 62/753,815, filed on Oct. 31, 2018.

(56) References Cited

U.S. PATENT DOCUMENTS

| | | | |
|---|---|---|---|
| 7,535,152 | B2 | 5/2009 | Ogami et al. |
| 7,684,109 | B2 | 3/2010 | Godshalk et al. |
| 7,868,519 | B2 | 1/2011 | Umeda |
| 8,278,802 | B1 | 10/2012 | Lee et al. |
| 8,829,766 | B2 | 9/2014 | Milyutin et al. |
| 8,932,686 | B2 | 1/2015 | Hayakawa et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,780,759 | B2 | 10/2017 | Kimura et al. |
| 2002/0158714 | A1 | 10/2002 | Kaitila et al. |
| 2004/0261250 | A1 | 12/2004 | Kadota et al. |
| 2011/0109196 | A1 | 5/2011 | Goto |
| 2013/0234805 | A1 | 9/2013 | Takahashi |
| 2014/0145556 | A1 | 5/2014 | Kadota |
| 2014/0151151 | A1 | 6/2014 | Reinhardt |
| 2015/0319537 | A1 | 11/2015 | Perois et al. |
| 2015/0333730 | A1 | 11/2015 | Meltaus |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2019/0068164 | A1 | 2/2019 | Houlden et al. |
| 2019/0131953 | A1 | 5/2019 | Gong |
| 2019/0273480 | A1 | 9/2019 | Lin |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

TRANSVERSELY-EXCITED FILM BULK ACOUSTIC FILTERS WITH SYMMETRIC LAYOUT

RELATED APPLICATION INFORMATION

This patent is a continuation in part of application Ser. No. 16/829,617, filed Mar. 25, 2020, entitled HIGH POWER TRANSVERSELY-EXCITED FILM BULK ACOUSTIC RESONATORS ON Z-CUT LITHIUM NIOBATE, which is a continuation of application Ser. No. 16/578,811, filed Sep. 23, 2019, entitled TRANSVERSELY-EXCITED FILM BULK ACOUSTIC RESONATORS FOR HIGH POWER APPLICATIONS, now U.S. Pat. No. 10,637,438 B2, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192 B2, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to bandpass filters with high power capability for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size, and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
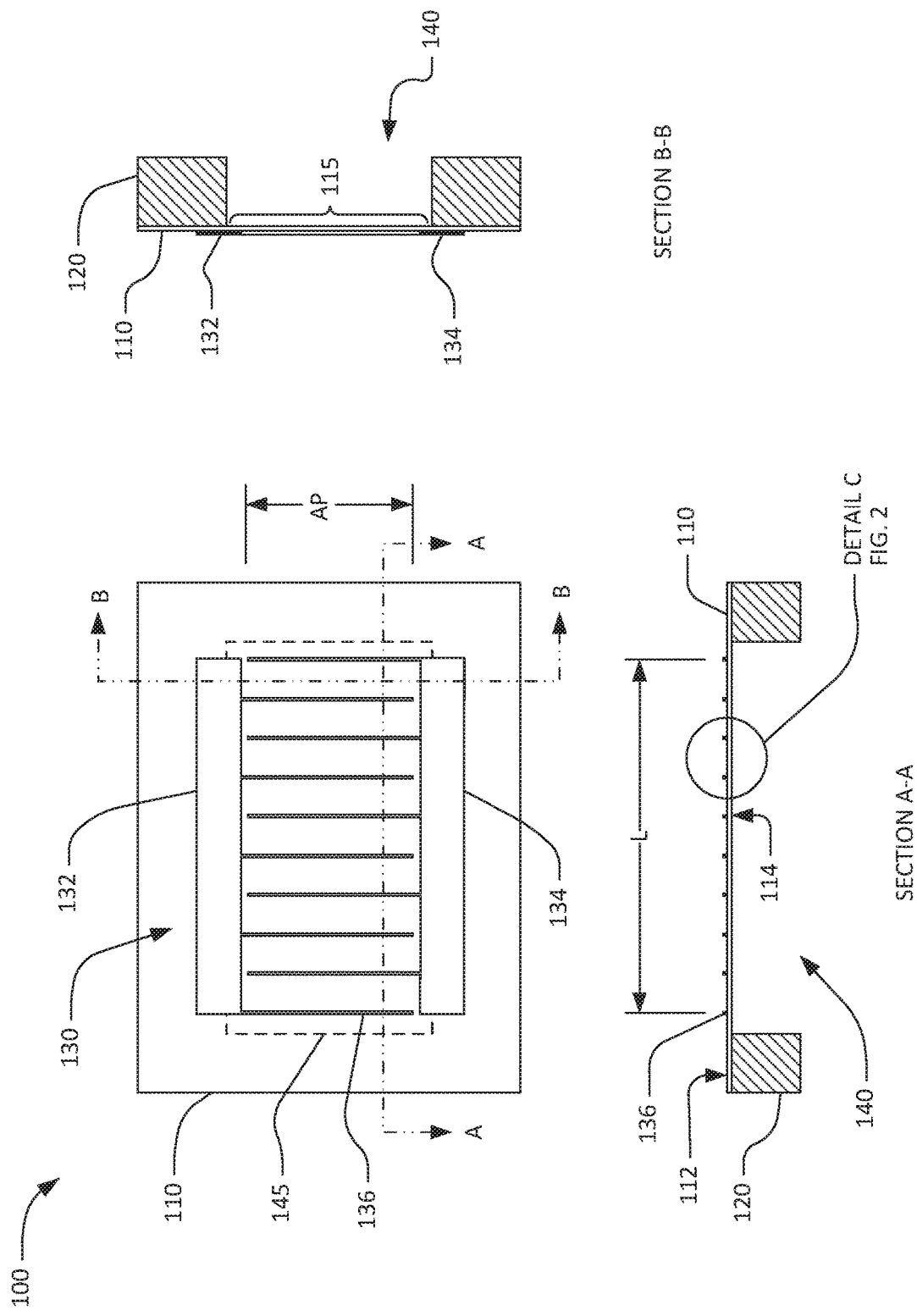
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate are at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
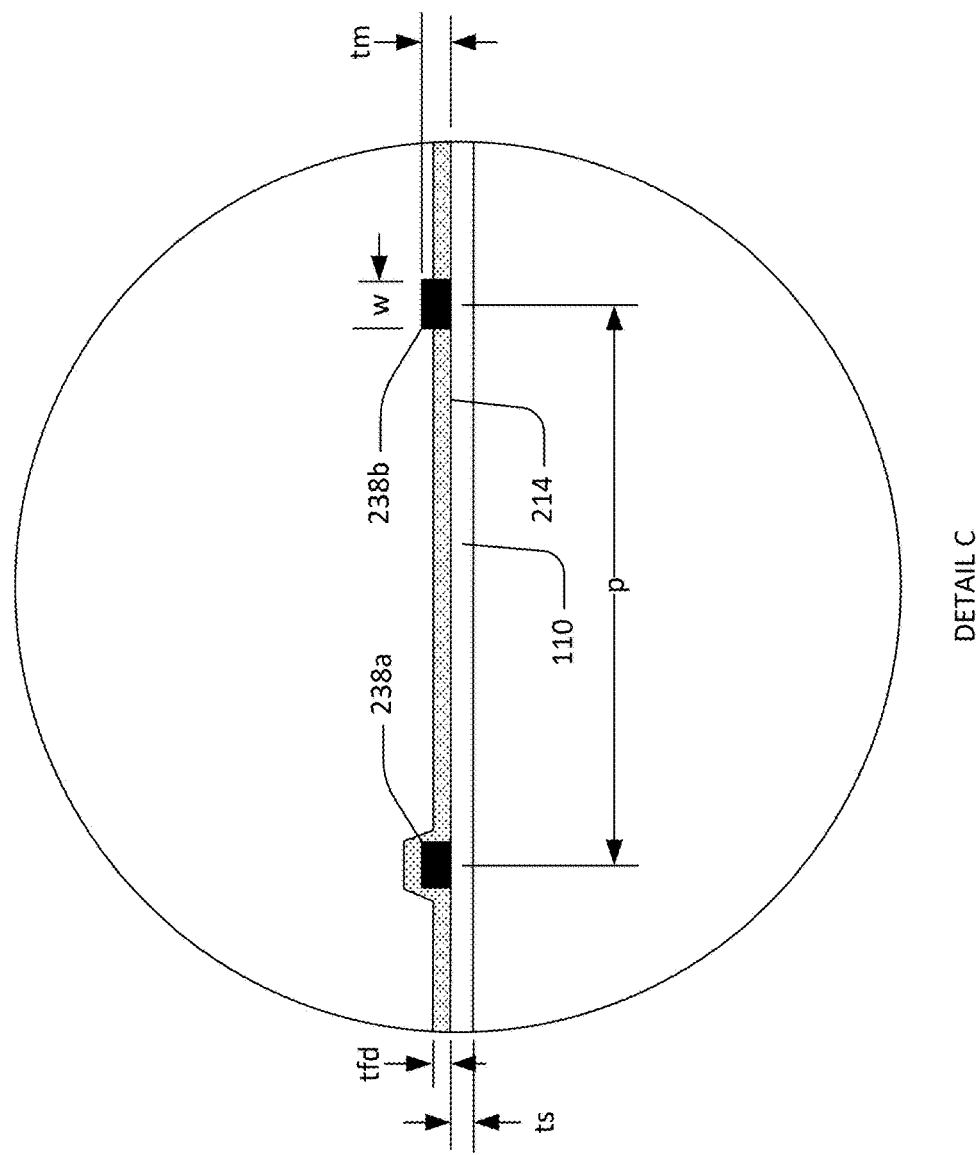
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectric material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 may be formed only between the IDT fingers (e.g. IDT finger 238b) or may be deposited as a blanket layer such that the dielectric layer is formed both between and over the IDT fingers (e.g. IDT finger 238a). The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials.

The IDT fingers 238a and 238b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
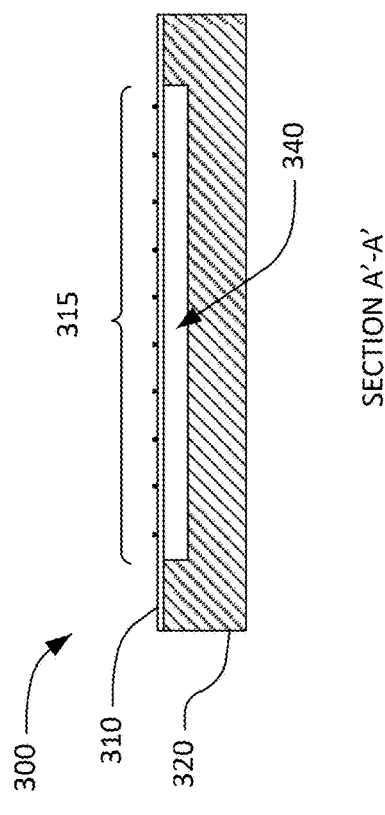
FIG. 3A is an alternative schematic cross-sectional view of the XBAR of FIG. 1.
Figure 3B:
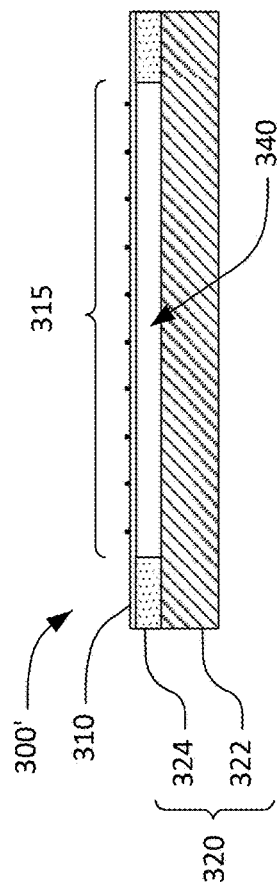
FIG. 3B is another alternative schematic cross-sectional view of the XBAR of FIG. 1.

FIG. 3A and FIG. 3B show two alternative cross-sectional views along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may contiguous with the rest of the piezoelectric plate 310 around a large portion of a perimeter of the cavity 340. For example, the diaphragm 315 may contiguous with the rest of the piezoelectric plate 310 around at least 50% of the perimeter of the cavity 340. An intermediate layer (not shown), such as a dielectric bonding layer, may be present between the piezoelectric plate 310 and the substrate 320.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A portion of the piezoelectric plate 310 forms a diaphragm 315 spanning a cavity 340 in the intermediate layer 324. Fingers of an IDT are disposed on the diaphragm 315. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340 as shown in FIG. 3C. Although not shown in FIG. 3B, a cavity formed in the intermediate layer 324 may extend into the base 322.

Figure 4:
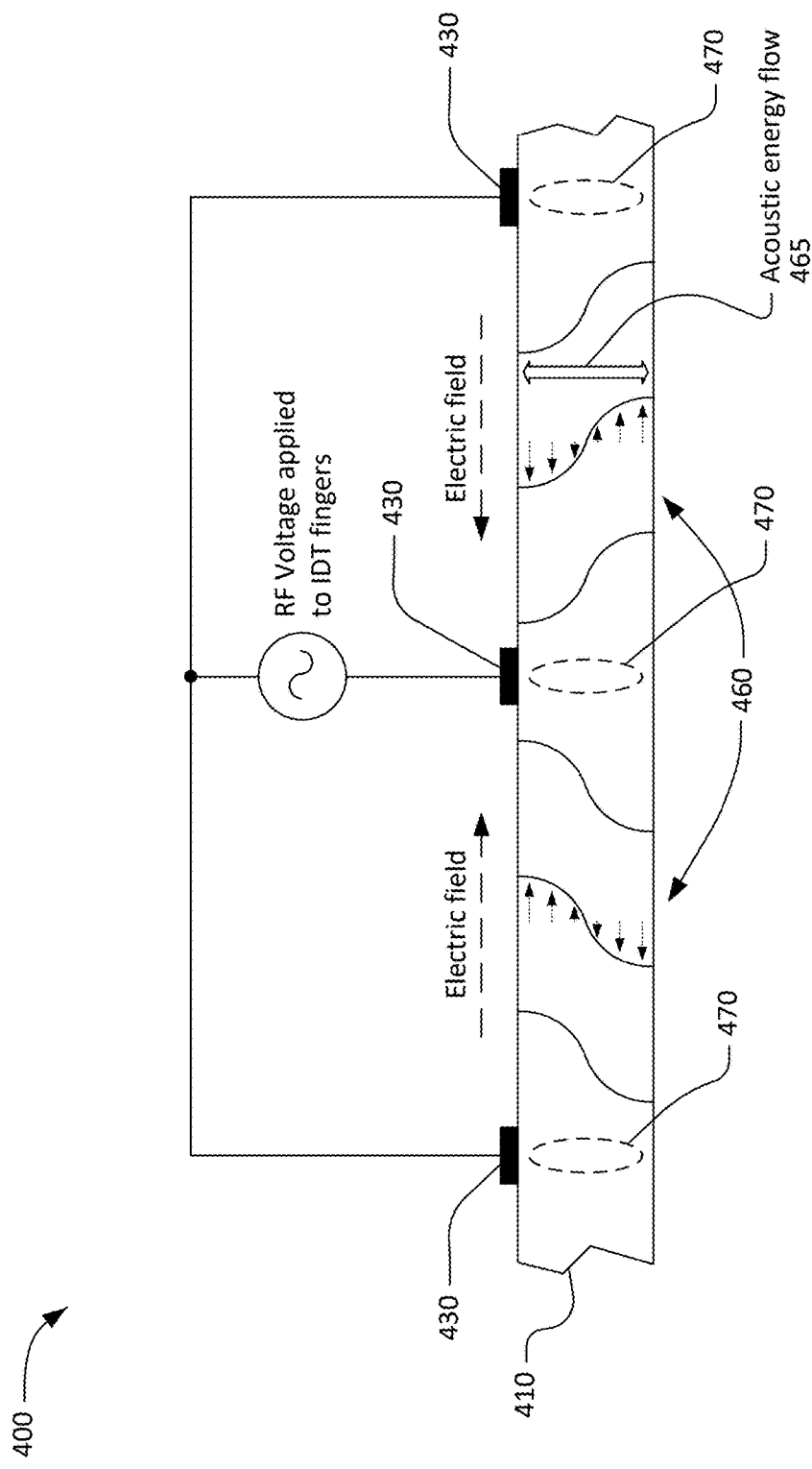
FIG. 4 is a graphic illustrating a primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 which alternate in electrical polarity from finger to finger. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 410. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and relative magnitude of atomic motion at the resonance frequency. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary acoustic mode is substantially orthogonal to the surface of the piezoelectric plate, as indicated by the arrow 465.

Considering FIG. 4, there is essentially no RF electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator) for the primary acoustic mode, which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
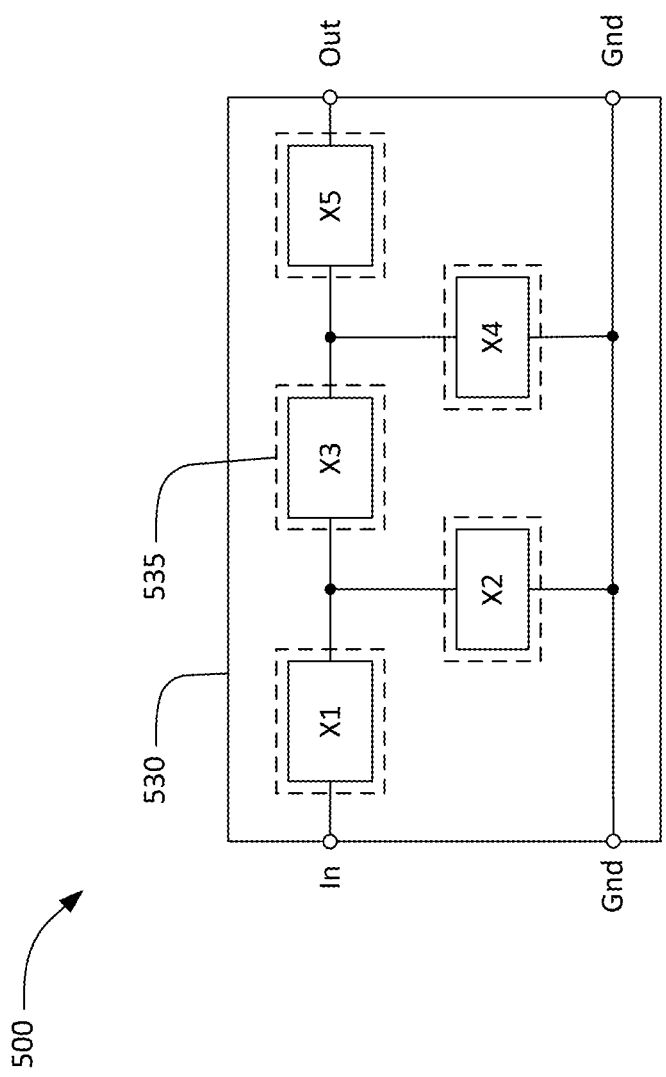
FIG. 5 is a schematic circuit diagram of a band-pass filter using acoustic resonators in a ladder circuit.

FIG. 5 is a schematic circuit diagram of a band-pass filter 500 using five XBARs X1-X5. The filter 500 may be, for example, a band n79 band-pass filter for use in a communication device. The filter 500 has a conventional ladder filter architecture including three series resonators X1, X3, X5 and two shunt resonators X2, X4. The three series resonators X1, X3, X5 are connected in series between a first port and a second port. In FIG. 5, the first and second ports are labeled "In" and "Out", respectively. However, the filter 500 is symmetrical and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 500 maybe formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, an IDT of each resonator is disposed over a respective cavity. In other filters, the IDTs of two or more resonators may be disposed over a common cavity. Resonators may also be divided into multiple sub-resonators with IDTs formed over respective cavities.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators are above the passband, and the resonance frequencies of the shunt resonators are below the passband.

Figure 6:
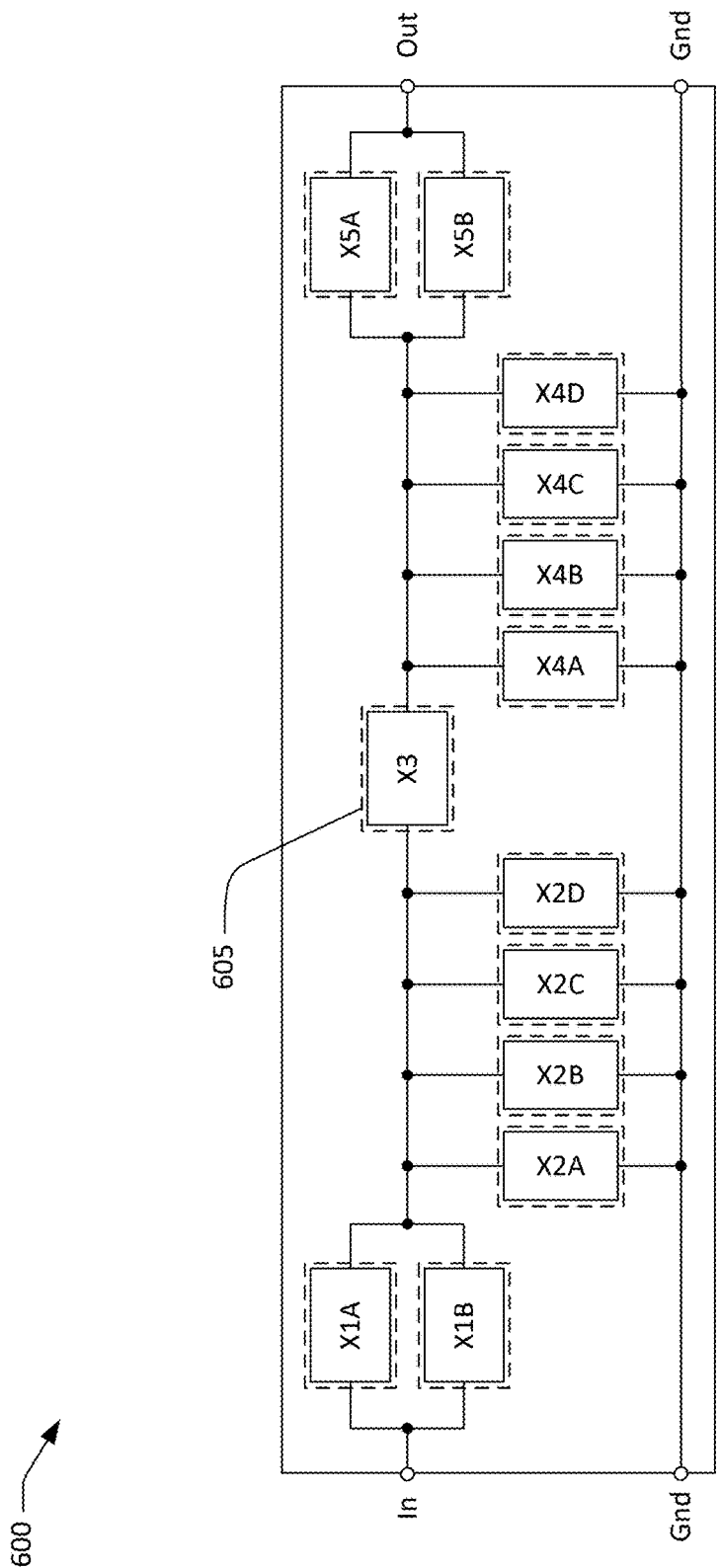
FIG. 6 is a schematic circuit diagram of an exemplary high-power band-pass filter using XBARs.

FIG. 6 is a schematic diagram of an exemplary high-power XBAR band-pass filter for band n79. The circuit of the band-pass filter 600 is a five-resonator ladder filter, similar to that of FIG. 5. Series resonators X1 and X5 are each partitioned into two sub-resonators (X1A/B and X5A/B, respectively) connected in parallel. Shunt resonators X2 and X4 are each divided into four sub-resonators (X2A/B/C/D and X4A/B/C/D, respectively) that are connected in parallel. Dividing the resonators into two or four sub-resonators has the benefit of reducing the length and/or width of each diaphragm. Reducing the diaphragm dimensions is effective to increase the mechanical rigidity of the diaphragm. Reducing the membrane width is further beneficial for reducing parasitic resistivity in IDTs through keeping the XBAR aperture narrower. Each of the sub-resonators is formed over a respective cavity, which are indicated by dashed rectangles (such as dashed rectangle 605).

The sub-resonators within a resonator are typically, but not necessarily, electrically and physically the same, which is to say the sub-resonators share a common aperture, a common length, a common pitch and a common IDT finger width or mark. The resonance and anti-resonance frequencies of all sub-resonators of a resonator need not be precisely the same. The frequency offset between the resonance frequencies of the sub-resonators of a shunt resonator should be no more than a few percent of the difference between the resonance and anti-resonance frequencies of the resonator. The frequency offset between the anti-resonance frequencies of the sub-resonators of a series resonator should be no more than a few percent of the difference between the resonance and anti-resonance frequencies of the resonator.

Figure 7:
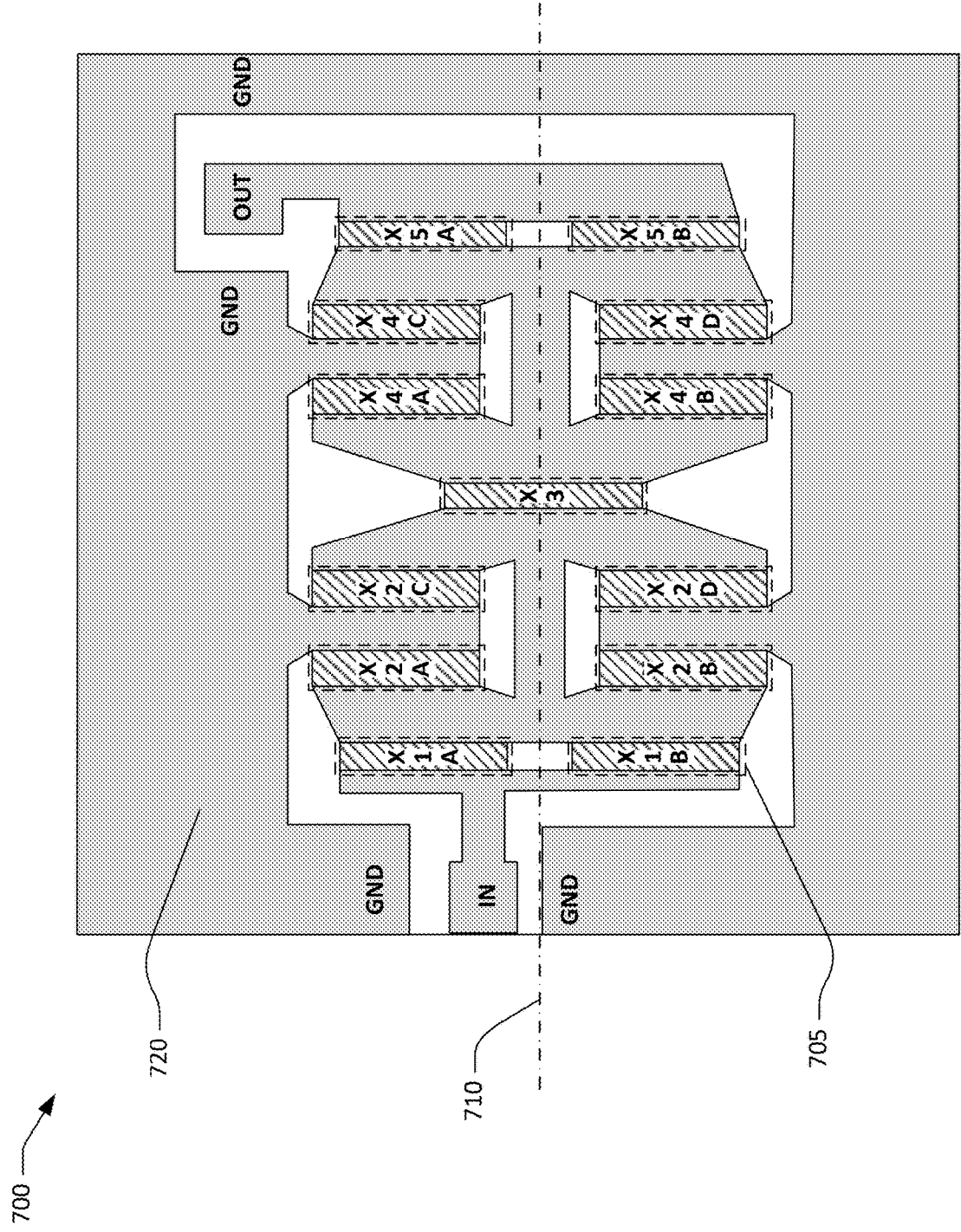
FIG. 7 is a layout of the filter of FIG. 6.

FIG. 7 shows an exemplary layout 700 for the band-pass filter 600. Cross-hatched rectangles represent the resonators and sub-resonators. Shaded areas 720 represent conductors formed on the surface of a piezoelectric plate. Dashed rectangles, such as the dashed rectangle 705, represent cavities underlying the resonators and sub-resonators. The dimensions of the various elements are not necessarily drawn to scale and the relative size and position of various elements may be distorted for ease of presentation.

In this example, the sub-resonators are arranged symmetrically in pairs about a central axis 710. The central axis 710 is a straight line that divides the filter into two sections of roughly equal area. For example, sub-resonators X1A and X1B form a pair and are disposed in symmetric positions on either side of the central axis 710. The two sub-resonators X1A and X1B are arranged in-line along the direction normal to the central axis and are equally spaced from the central axis. Similarly, sub-resonator pairs X2A/X2B, X2C/X2D, X4A/X4B, X4C/X4D, and X5A/X5B are disposed in symmetric positions with respect to the central axis 710. The signal path flows generally along the central axis 710.

The symmetrical arrangement of the sub-resonators about the central axis 710 results in an even distribution of the resonators and cavities over the area of the filter. Symmetrical arrangement of the sub-resonators about the central axis 710 also facilitates simple conductor routing between resonators, which avoids long conductors that can introduce undesired inductance and coupling between elements of the filter. For example, imagine resonator X2 is not divided into sub-resonators, but is a dingle resonator having twice the length and width of the sub-resonators shown in FIG. 7. The left side (all directions refer to FIG. 7) of X2 can be directly connected to resonator X1 and the right side of X2 is connected to a ground conductor. The connection between X1 and X3 must be routed around X2, resulting in a much longer conductor that is parallel to ground conductors for much of its length. The longer conductor results in additional inductance in the connection between X1 and X3 and increased stray capacitance to ground.

Further, positioning shunt resonator segments as shown in FIG. 7 minimizes the distance between the center of each resonator portion and the wide ground conductors at the top and bottom (as seen in FIG. 7) of the device. Shortening this distance facilitates removing heat from the shunt resonator segments.

Series resonator X3, which is not divided into sub-resonators, is disposed along, and roughly bisected by, central axis 710. In other filters, the input port IN and the output port OUT may also be disposed along the central axis 710.

Figure 8:
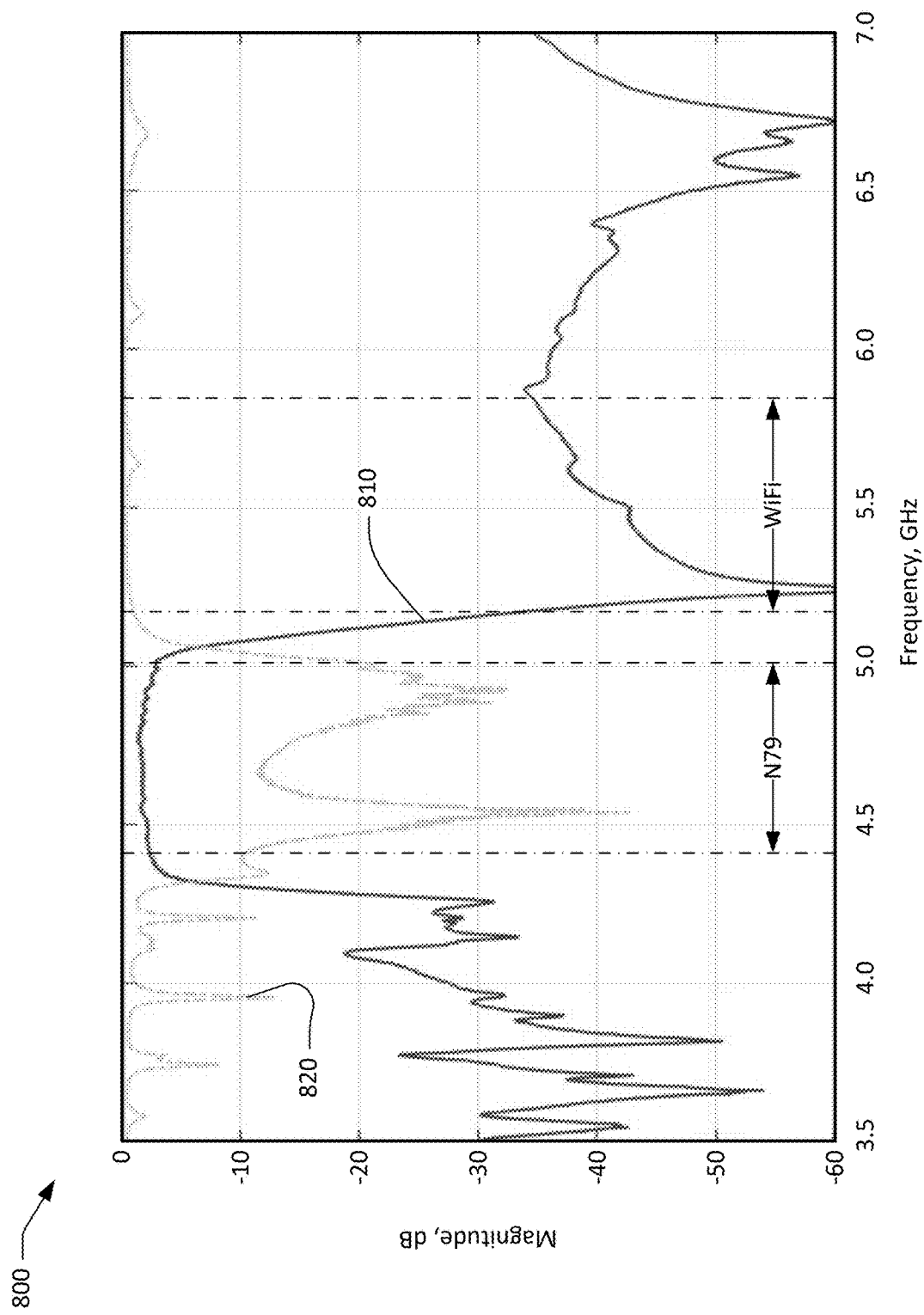
FIG. 8 is a graph of measured S-parameters S11 and S21 versus frequency for the filter of FIG. 6 and FIG. 7.

FIG. 8 is a chart 800 showing measured performance of the band-pass filter 600. The XBARs are formed on a Z-cut lithium niobate plate. The thickness is of the lithium niobate plate is 400 nm. The substrate is silicon, the IDT conductors are aluminum, the front-side dielectric, where present, is SiO2. The thickness tm of the IDT fingers is 500 nm, such that tm/ts=1.25. The other physical parameters of the resonators are provided in the following table (all dimensions are in microns; p=IDT pitch, w=IDT finger width, AP=aperture, L=length, and tfd=front-side dielectric thickness):

| Parameter | Series Resonators | | | Shunt Resonators | |
| --- | --- | --- | --- | --- | --- |
| | X1* | X3 | X5* | X2** | X4** |
| p | 3.75 | 3.75 | 3.75 | 4.12 | 4.12 |
| w | 1.01 | 0.86 | 1.10 | 0.84 | 0.93 |
| AP | 44 | 37 | 41 | 58 | 57 |
| L | 350 | 420 | 350 | 350 | 350 |
| tfd | 0 | 0 | 0 | 0.100 | 0.100 |

*Each of 2 sub-resonators
**Each of 4 sub-resonators

In FIG. 8, the solid line 810 is a plot of S(1,2), which is the input-output transfer function of the filter, as a function of frequency. The dashed line 820 is a plot of S(1,1), which is the reflection at the input port, as a function of frequency. The dash-dot vertical lines delimit band N79 from 4.4 to 5.0 GHz and the 5 GHz Wi-Fi band from 5.17 GHz to 5.835 GHz. Both plots 810, 820 are based on wafer probe measurements having 50-ohm impedance.

Figure 9:
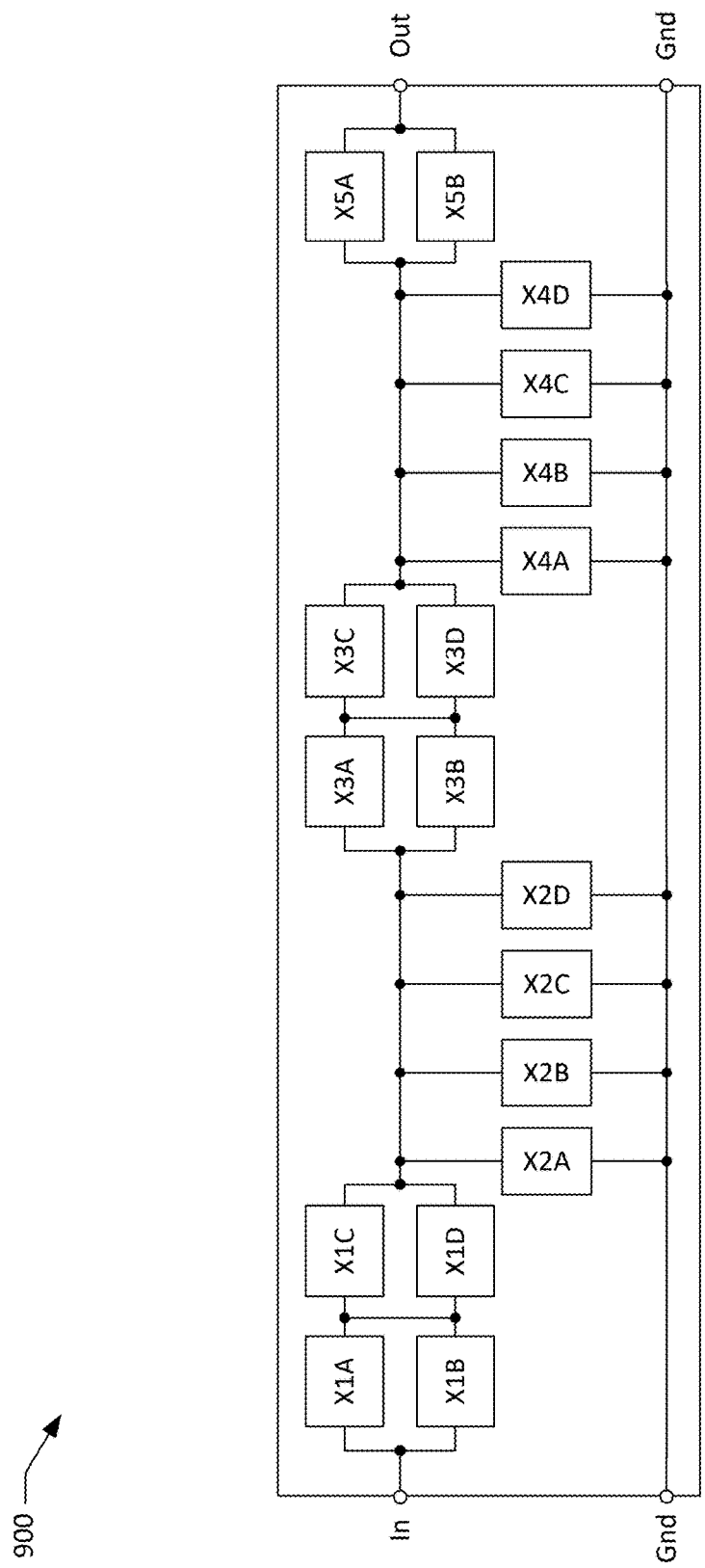
FIG. 9 is a schematic circuit diagram of another exemplary high-power band-pass filter using XBARs.

FIG. 9 is a schematic diagram of another exemplary high-power XBAR band-pass filter 900. The circuit of the band-pass filter 900 is a five-resonator ladder filter, similar to that of FIG. 5. Series resonators X1 and X3 are each partitioned into four sub-resonators (X1A/B/C/D and X3A/B/C/D, respectively). In each case, the A sub-resonator is connected in parallel with the B sub-resonator and the C sub-resonator is connected in parallel with the D sub-resonator. The A-B parallel combination is connected in series with the C-D parallel combination. Series resonator X5 is divided into two sub-resonators (X5A and X5B) which are connected in parallel. Shunt resonators X2 and X4 are each divided into four sub-resonators (X2A/B/C/D and X4A/B/C/D, respectively) that are connected in parallel. Dividing the resonators into two or four sub-resonators has the benefit of reducing the size (i.e. the length and area) of each diaphragm. Reducing the diaphragm size facilitates removing heat from the diaphragms and improves the mechanical strength of the diaphragms.

Figure 10:
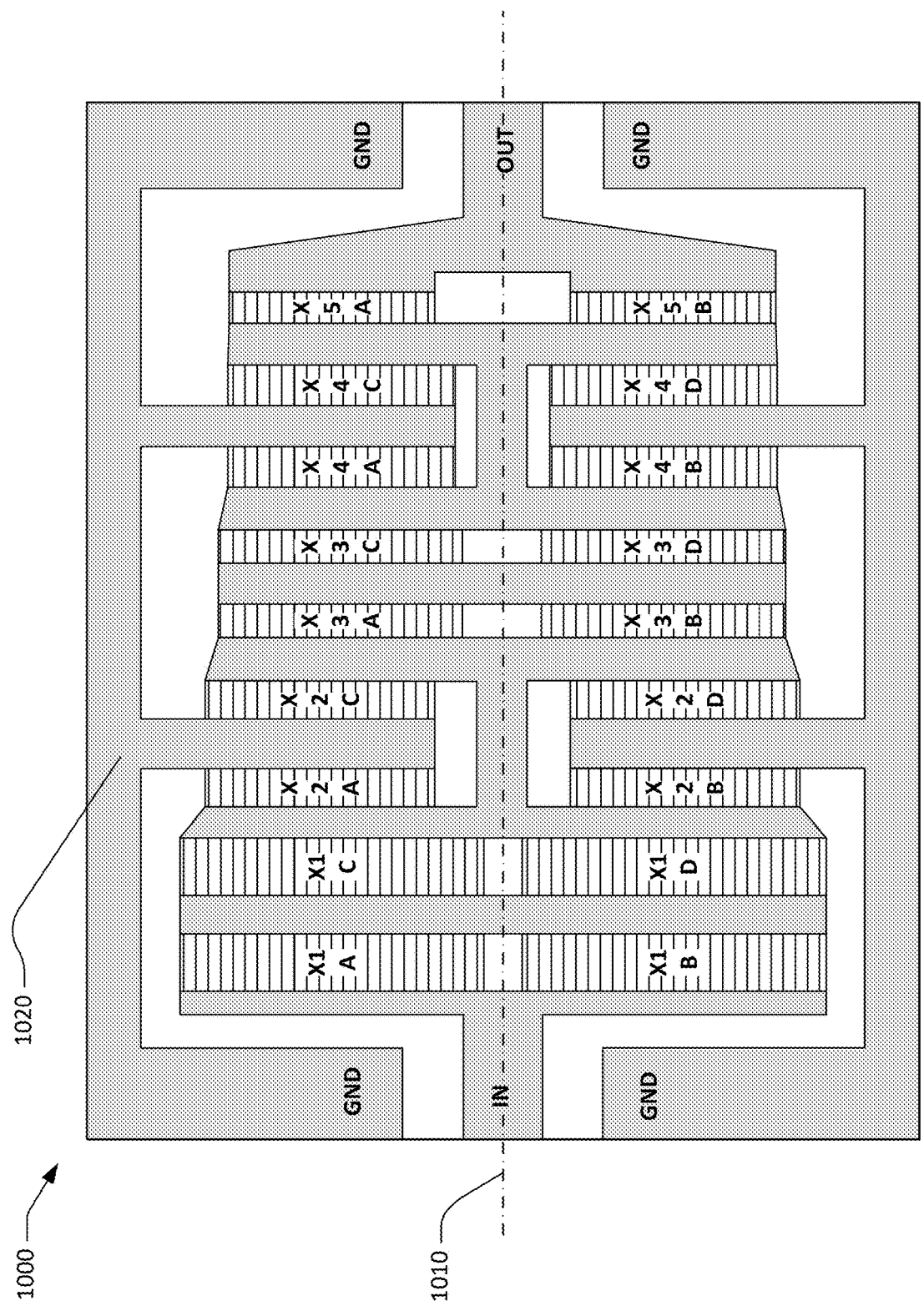
FIG. 10 is a layout of the filter of FIG. 9.

FIG. 10 shows an exemplary layout 1000 for the band-pass filter 900. Cross-hatched rectangles represent the sub-resonators. Shaded areas 1020 represent conductors formed on the surface of a piezoelectric plate. Each sub-resonator is disposed over a respective cavity. Cavities are not shown.

In this example, the series resonators (X1, X3, X5) and the shunt resonators (X2, X4) are disposed alternately along a central axis 1010 of the device 1000. The sub-resonators are arranged symmetrically in pairs about the central axis 1010. Specifically, all of the resonators are divided into two or four sub-resonators, with pairs of sub-resonators (i.e. X1A/X1B, X1C/X1D, etc.) positioned symmetrically about the central axis 1010. The signal path flows generally along the central axis 1010 from an input port IN to an output port OUT, which are also disposed along the central axis 1010. The symmetrical arrangement of the resonators shortens the path length between the IN and OUT ports and reduces undesired coupling between elements of the filter to improve stop-band rejection. Positioning the shunt sub-resonators in this manner minimizes the distance between the center of each sub-resonator and the wide ground conductors at the top and bottom (as seen in FIG. 10) of the device. Shortening this distance facilitates removing heat from the shunt sub-resonators.

Figure 11:
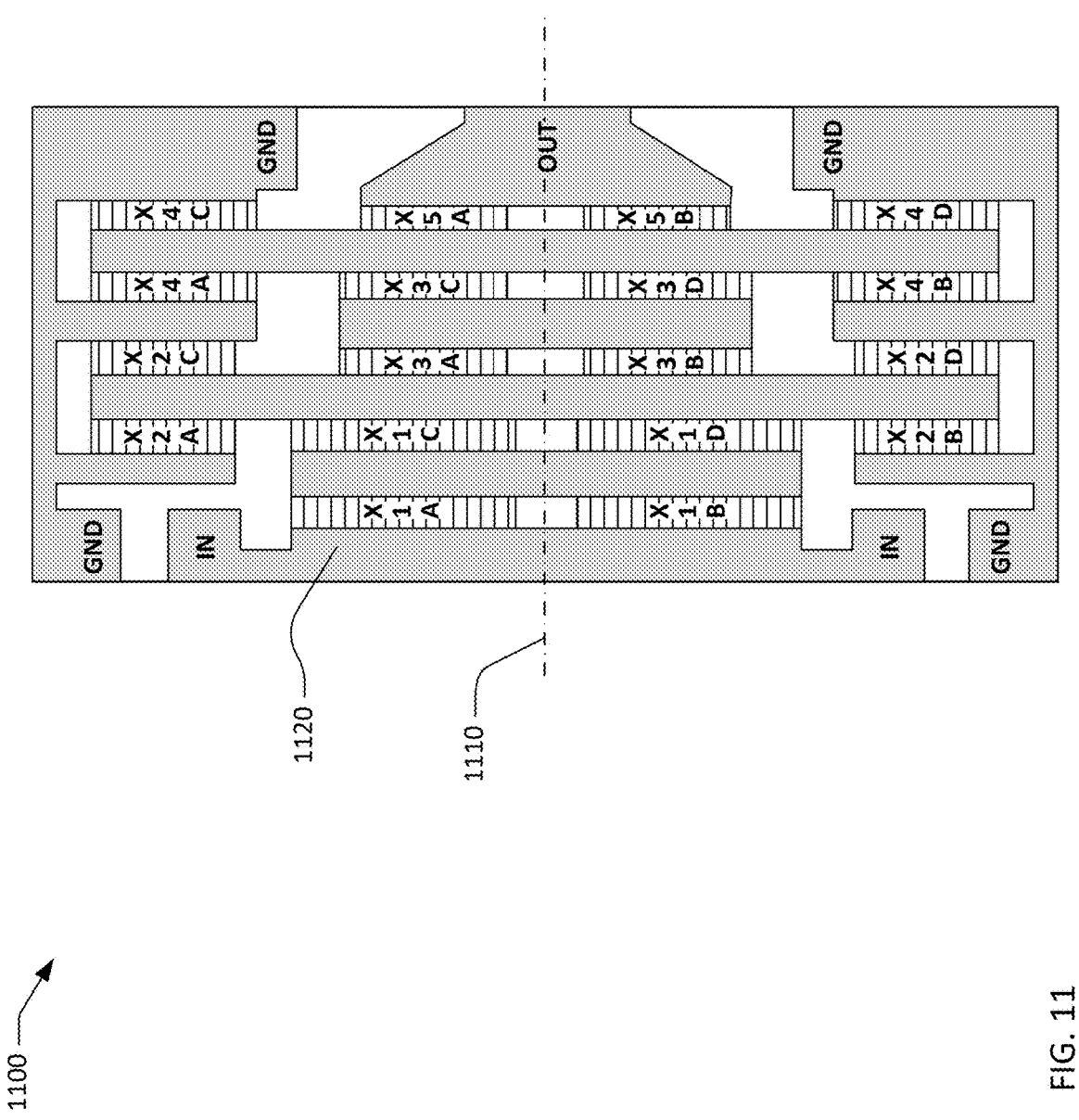
FIG. 11 is an alternative layout of the filter of FIG. 9.

FIG. 11 shows another exemplary layout 1100 for the band-pass filter 900. Cross-hatched rectangles represent the sub-resonators. Shaded areas 1120 represent conductors formed on the surface of a piezoelectric plate. Each sub-resonator is disposed over a respective cavity. Cavities are not shown.

As in the previous example layout 1000, the sub-resonators are arranged symmetrically in pairs about a central axis 1110. All of the resonators are divided into two or four sub-resonators, with pairs of sub-resonators (i.e. X1A/X1B, X1C/X1D, etc.) positioned symmetrically about the central axis. The signal path flows generally along the central axis 1110 from an input port IN to an output port OUT. The series resonators X1, X3, and X5 are positioned in sequence along the central axis. The shunt resonators X2 and X4 are positioned outboard of the series resonators. In this context, "outboard" is defined as "in a position farther or farthest from the longitudinal axis." The location of the series resonators in adjacent positions along the central axis provides the shortest path length between the IN and OUT ports. Placing the shunt resonators outboard of the series resonators results in a rectangular chip with a height (i.e. the vertical direction as shown in FIG. 11) substantially greater than its width. Two such rectangular chips may be combined in a single relatively square package for a duplexer.

Figure 12:
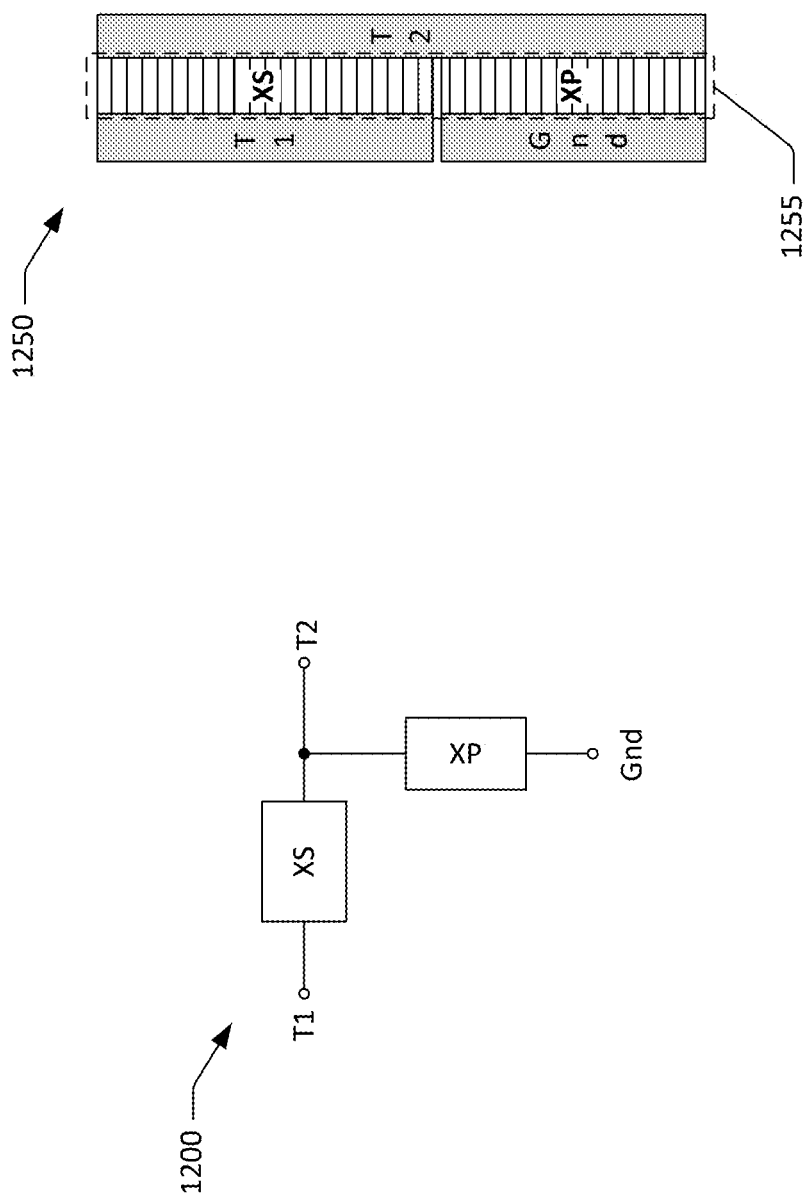
FIG. 12 is an illustration of a series resonator and a shunt resonator sharing a common diaphragm.

FIG. 12 shows a schematic diagram of a sub-circuit 1200 including a series sub-resonator XS and a shunt (parallel) sub-resonator XP. The sub-circuit 1200 may be a portion of a ladder filter circuit such as the ladder filter circuits 500, 600, and 900.

FIG. 12 also shows a layout 1250 of the filter sub-circuit 1200. The series and shunt sub-resonators XS and XP are arranged in-line and share a common diaphragm over a common cavity 1255. For example, XS and XP may be X1D and X2B, respectively, of the filter layout 1100 of FIG. 11. Having X1D and X2B (and similarly X1C and X2A) share a common diaphragm would decrease the height of the filter chip.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator, comprising:
a single-crystal piezoelectric plate having front and back surfaces, the back surface attached to a surface of a substrate except for portions of the piezoelectric plate forming a plurality of diaphragms, each of which spans a respective cavity in the substrate; and
a conductor pattern formed on the front surface, the conductor pattern comprising interdigital transducers (IDTs) of one or more pairs of sub-resonators, wherein
the IDT of each sub-resonator comprises interleaved fingers disposed over a respective diaphragm,
the two sub-resonators of each pair of sub-resonators are positioned symmetrically about a central axis, and
the IDTs of all of the sub-resonators have a common pitch.

2. The acoustic resonator of claim 1, wherein
the conductor pattern comprises two or more pairs of sub-resonators, and
all of the sub-resonators of the two or more pairs of sub-resonators are electrically connected in parallel.

3. The acoustic resonator of claim 1, wherein all of the sub-resonators have a common length, a common aperture, and a common IDT finger width.

4. An acoustic resonator, comprising:
a single-crystal piezoelectric plate having front and back surfaces, the back surface attached to a surface of a substrate except for portions of the piezoelectric plate forming a plurality of diaphragms, each of which spans a respective cavity in the substrate; and
a conductor pattern formed on the front surface, the conductor pattern comprising interdigital transducers (IDTs) of one or more pairs of sub-resonators, wherein
the IDT of each sub-resonator comprises interleaved fingers disposed over a respective diaphragm,
the two sub-resonators of each pair of sub-resonators are positioned symmetrically about a central axis, and
the IDTs of all of the sub-resonators have a common pitch.

5. A radio frequency filter device comprising:
a substrate having a surface;
a single-crystal piezoelectric plate having front and back surfaces, the back surface attached to the surface of the substrate except for portions of the piezoelectric plate forming a plurality of diaphragms, each of which spans a respective cavity in the substrate; and
a conductor pattern formed on the front surface, the conductor pattern defining a ladder filter circuit including a plurality of acoustic resonators, one or more resonators from the plurality of acoustic resonators divided respectively into one or more pairs of sub-resonators, wherein
each sub-resonator comprises an interdigital transducer (IDT) with interleaved fingers disposed over a diaphragm from the plurality of diaphragms, and the two sub-resonators of each pair of sub-resonators are arranged in symmetrical positions with respect to a central axis of the filter device.

6. The radio frequency filter device of claim 5, wherein, for each of the plurality of acoustic resonators, the IDTs of all of the respective sub-resonators have a common pitch.

7. The radio frequency filter device of claim 6, wherein, for each of the plurality of acoustic resonators, all of the respective sub-resonators have a common length, a common aperture, and a common IDT finger width.

8. The radio frequency filter device of claim 6, wherein a resonator of the one or more resonators comprises a first pair of sub-resonators and a second pair of sub-resonators, the two sub-resonators of the first pair of sub-resonators are electrically connected in parallel, the two sub-resonators of the second pair of sub-resonators are electrically connected in parallel, and the first pair of sub-resonators and the second pair of sub-resonators are electrically connected in series.

9. The radio frequency filter device of claim 6, wherein the plurality of resonators further comprises one or more undivided resonators, and each of the undivided resonators is disposed along the central axis of the device.

10. The radio frequency filter device of claim 9 wherein each of the one or more undivided resonators is approximately bisected by the central axis of the device.

11. The radio frequency filter device of claim 5, wherein the plurality of acoustic resonators includes two or more series resonators and two or more shunt resonators.

12. The radio frequency filter device of claim 11, wherein the two or more series resonators and the two or more shunt resonators are disposed alternately along the central axis of the device.

13. The radio frequency filter device of claim 11, wherein the two or more series resonators are disposed in sequence along the central axis of the device and the two or more shunt resonators are disposed outboard of the series resonators.

14. The radio frequency filter device of claim 13, wherein IDT fingers of a sub-resonator of one of the shunt resonators and IDT fingers of a sub-resonator of one of the series resonators are disposed on the same diaphragm.

15. The radio frequency filter device of claim 6, wherein a resonator of the one or more resonators is divided into two or more pairs of sub-resonators, and all of the sub-resonators of the two or more pairs of sub-resonators are electrically connected in parallel.

* * * * *